United States Patent
Cohen

(10) Patent No.: US 9,817,031 B2
(45) Date of Patent: Nov. 14, 2017

(54) MAGNETICALLY COUPLED DC CURRENT SENSOR

(71) Applicant: Texas Instruments Incorporated, Dallas, TX (US)

(72) Inventor: Isaac Cohen, Dix Hills, NY (US)

(73) Assignee: Texas Instruments Incorporated, Dallas, TX (US)

( * ) Notice: Subject to any disclaimer, the term of this patent is extended or adjusted under 35 U.S.C. 154(b) by 10 days.

(21) Appl. No.: 14/592,346

(22) Filed: Jan. 8, 2015

(65) Prior Publication Data

US 2015/0212116 A1 Jul. 30, 2015

Related U.S. Application Data

(60) Provisional application No. 61/931,373, filed on Jan. 24, 2014.

(51) Int. Cl.
*G01R 15/18* (2006.01)
*G01R 1/20* (2006.01)
*G01R 19/20* (2006.01)

(52) U.S. Cl.
CPC .............. *G01R 1/20* (2013.01); *G01R 19/20* (2013.01)

(58) Field of Classification Search
CPC .................................. G01R 15/18; G01R 1/20
See application file for complete search history.

(56) References Cited

U.S. PATENT DOCUMENTS

| 5,552,979 | A | * | 9/1996 | Gu | ........................ | G01R 15/183 324/117 R |
| 5,811,965 | A | * | 9/1998 | Gu | ......................... | G01R 15/18 324/117 R |
| 2010/0277095 | A1 | * | 11/2010 | Loef | ................. | H02M 3/33561 315/294 |

* cited by examiner

*Primary Examiner* — Jermele M Hollington
(74) *Attorney, Agent, or Firm* — William B. Kempler; Charles A. Brill; Frank D. Cimino

(57) ABSTRACT

A method for measuring current includes passing a DC current through the primary side of a transformer and driving the secondary side of the transformer with an AC voltage, wherein the current in the secondary side of the transformer reaches a plateau. The current in the secondary side of the transformer is measured during the plateau, wherein the measured current is proportional to the DC current.

26 Claims, 4 Drawing Sheets

MAGNETICALLY COUPLED DC CURRENT SENSOR

This application claims priority to U.S. provisional patent application 61/931,373 of Isaac Cohen for MAGNETICALLY COUPLED DC CURRENT SENSOR filed on Jan. 24, 2014, which is incorporated by reference for all that is disclosed.

BACKGROUND

Isolated DC current sensors remotely sense or measure DC current. Some isolated DC current sensors include a transformer or the like that have a primary side and a secondary side. The primary side typically has one turn or, just a few turns and is for passing the DC current. The DC current flowing through the primary side generates a field that ultimately induces a current in the secondary side, which is referred to as the secondary current. The secondary current generated in the secondary side of the transformer is measured and is provided as an output that is indicative of or proportional to the DC current. One of the benefits of such isolated DC current sensors is that there is no physical connection between circuits generating the measured current and the DC current sensing circuits.

SUMMARY

A method for measuring current includes passing a DC current through the primary side of a transformer and driving the secondary side of the transformer with an AC voltage, wherein the current in the secondary side of the transformer reaches a plateau. The current in the secondary side of the transformer is measured during the plateau, wherein the measured current is proportional to the DC current.

DETAILED DESCRIPTION

Figure 1:
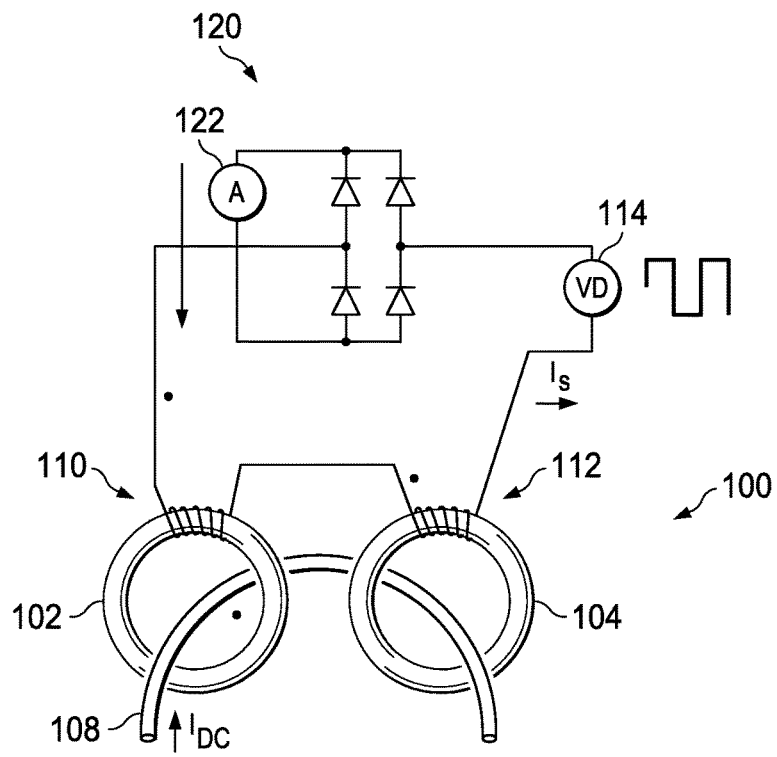
FIG. 1 is a schematic illustration of a prior art current sensor.

FIG. 1 is an illustration of a prior art current sensor 100. The current sensor 100 includes two cores, which are referenced individually as the first core 102 and the second core 104. In ideal situations, the cores 102, 104 have infinite permeability. However, in realistic applications, the cores 102, 104 have very high permeability. A conductor 108 that carries a DC current $I_{DC}$ extends through the cores 102, 104. As shown in FIG. 1, the conductor 108 extends through the first core 102 in a first direction and the conductor 108 extends through the second core 104 in a second direction.

The first core 102 is wound with a first winding 110 and the second core 104 is wound with a second winding 112. For illustration purposes, only a few turns of windings 110, 112 are shown in FIG. 1, however, in most examples, there are many turns, such as hundreds or thousands of turns on each core. The windings 110, 112 are connected in series, so that the current induced by the DC current $I_{DC}$ in the first winding 110 is opposite the current induced in the second winding 112. The windings 110, 112 are coupled or otherwise connected to a voltage supply 114 that generates a drive voltage $V_D$. In addition, the windings 110, 112 are coupled to a bridge 120. In the example of FIG. 1, the drive voltage $V_D$ is a square wave as shown in the graph 2A. Under ideal circumstances, the drive voltage $V_D$ has a 50% duty cycle, so the drive voltage $V_D$ has a first polarity during the first half of its cycle and the reverse polarity during the second half of the cycle.

A secondary current $I_S$ flows through the windings 110, 112 in response to the drive voltage $V_D$ and the DC current $I_{DC}$. Under ideal circumstances, the secondary current $I_S$ peaks at values of positive peak current $I_{P+}$ and negative peak current $I_{P-}$, which both have an amplitude of $I_{DC}/N$, where N is the turns ratio in each of the windings 102, 104. In the example of FIG. 1, the conductor 108 extends through the cores 102, 104, so the turns ratio N is the number of turns on the windings 110 and 112. The secondary current $I_S$ is rectified by the bridge 120 and measured by a current measuring device 122. Under the ideal circumstances of FIG. 2B, the rectified secondary current $I_S$ would be a perfect DC current with an average value equal to the DC current $I_{DC}$ divided by the number of turns in the windings 110, 112.

Figure 2A:
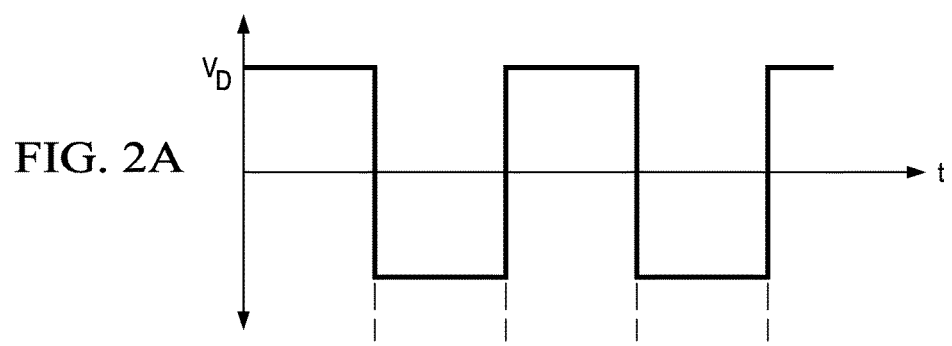
FIG. 2A is a graph of an example of the drive voltage of FIG. 1.
Figure 2B:
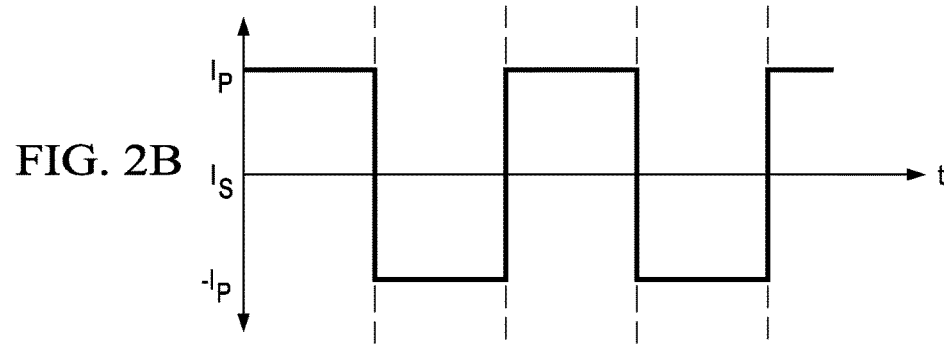
FIG. 2B is a graph of an example of the ideal secondary current in the current sensor of FIG. 1 in response to the drive voltage and the DC current.
Figure 2C:
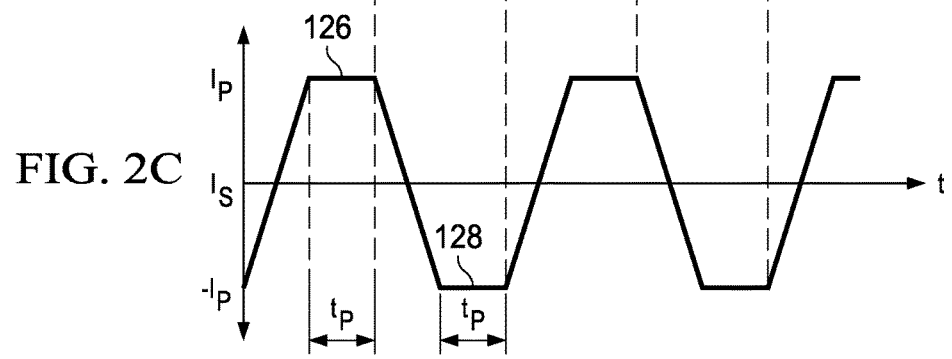
FIG. 2C is a graph of an example of the realistic secondary current in the current sensor of FIG. 1 in response to the drive voltage and the DC current.

Under real conditions, the permeability of the cores 102, 104 is not infinite, leakage inductance exists, and the windings 110, 112 have resistance. As such, the secondary current $I_S$ does not instantly follow the DC current $I_{DC}$. An example of the secondary current $I_S$ under non-ideal circumstances is shown by the graph of FIG. 2C. As shown in FIG. 2C, the waveform of the secondary current $I_S$ is substantially trapezoidal rather than square as in the ideal circumstance of FIG. 2B. The trapezoidal waveform of FIG. 2C has plateaus 126 and 128 at the same positive peak current $I_{P+}$ and negative peak current $I_{P-}$ as the secondary current $I_S$ of FIG. 2B. If the trapezoidal waveform of FIG. 2C is rectified, the resulting waveform will not be a pure DC current and it will not be equal to $I_{DC}/N$. Accordingly, the resulting current measurement based on a rectified secondary current $I_S$ will not be correct.

An example embodiment of the present current sensor samples or otherwise measures the secondary current $I_S$ at one or both of the plateaus 126, 128. By timing the measurement to coincide with one or both of the plateaus 126, 128, the measurement is accomplished during a plateau period $t_P$ when the secondary current $I_S$ has reached a plateau. In some example embodiments, the timing for the measurement is correlated with the frequency of the drive voltage $V_D$ so that the measurement occurs during the plateau period $t_P$. In other examples embodiments, the secondary current $I_S$ is monitored for a plateau 126, 128 and the measurement is taken when a plateau 126, 128 is reached. For instance, a monitor (not shown) may monitor the secondary current $I_S$ and generate an instruction to perform the measurement when the derivative of the secondary current $I_S$ is zero or changes substantially, which is indicative of a plateau 126, 128. In other instances, the monitor may monitor the secondary current $I_S$ for a period of no change, which is indicative of the plateau. The above-described methods of monitoring for the plateau 126, 128 are applicable to all of the current sensor embodiments described herein.

The drive voltage $V_D$ in conventional current sensors is static, meaning that the frequency and amplitude of the drive voltage $V_D$ are constant. In such situations, the secondary current $I_S$ may not reach a plateau when the DC current $I_{DC}$ is large. For example, the secondary current $I_S$ may be in the form of a triangular wave with no plateau or its peak may not reach the value of $I_{DC}/N$. In situations where the drive voltage $V_D$ is high in order to enable high secondary currents $I_S$ resulting from high DC currents $I_{DC}$ to plateau, the sensor 100 may be using excessive energy by creating excessive plateau periods $t_P$ when the DC current $I_{DC}$ is low. For example, the static amplitude of the drive voltage $V_D$ may be kept high, which generates a long plateau period $t_P$, which may be longer than necessary to perform the measurement. The problem with generating the long plateau period $t_P$ is that the drive voltage $V_D$ remains high all the time, which consumes excessive power. The current sensors described herein include dynamic drive voltages, which overcome the above-described issues with static drive voltages.

Figure 3:
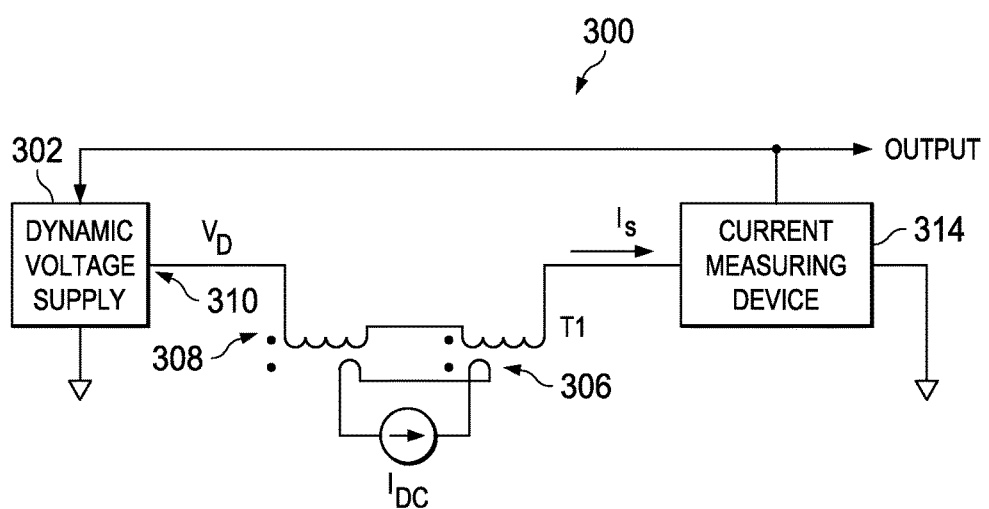
FIG. 3 is schematic diagram of an example of a two core current sensor that includes a dynamic voltage supply that generates the drive voltage.

FIG. 3 is schematic diagram of an example of a two core current sensor 300 that includes a dynamic voltage supply 302, which generates the drive voltage $V_D$. The two core sensor 300 enables the DC current $I_{DC}$ to be measured irrespective of the direction of the DC current $I_{DC}$. In some examples, the voltage supply 302 changes or modulates the amplitude of the drive voltage $V_D$ in response to the secondary current $I_S$. In other examples, the voltage supply 302 modulates or changes the frequency of the drive voltage $V_D$ in response to the secondary current $I_S$. In yet other examples, the voltage supply 302 modulates the amplitude and frequency of the drive voltage $V_D$ in response to the secondary current $I_S$.

The current sensor 300 measures the DC current $I_{DC}$, which is illustrated in FIG. 3 as being coupled across the primary side 306, or simply "primary 306," of a two-core transformer T1. In practice, the DC current $I_{DC}$ is typically a DC current flowing in a conductor, wherein the conductor is coupled to a circuit that generates the DC current $I_{DC}$. The transformer T1 in FIG. 3 is described as being a single device. However, in other embodiments, the transformer T1 is two devices, such as the device having two cores 102, 104 of FIG. 1. Accordingly, the primary 306 may be a conductor that passes through two cores as shown in FIG. 1.

The secondary 308 of the transformer T1 is coupled to the output 310 of the voltage supply 302, which outputs the drive voltage $V_D$. The drive voltage VD is a square wave, which in the example of FIG. 3 has a 50% duty cycle as shown by the graph of FIG. 2A. The secondary 308 is coupled to a current measuring device 314 that measures the secondary current $I_S$. The current sensor 314 generates an output signal that is indicative of the secondary current $I_S$, which is proportional to the DC current $I_{DC}$. In some examples, the output signal of the current measuring device 314 is a voltage and in other examples, the output signal is a digital signal or a current. In some examples described below, the current measuring device 314 includes sample and hold circuitry or other circuitry that measures the secondary current $I_S$ during the plateau periods $t_P$.

The value of the secondary current $I_S$ measured by the current measuring device 314 is fed back to the voltage supply 302, which generates the drive voltage $V_D$ in response to the secondary current $I_S$. In some examples, the voltage supply 302 generates the drive voltage $V_D$ that maintains the plateau peak $t_P$, FIG. 2, within predetermined limits. For example, when the DC current $I_{DC}$ rises, the durations of the plateaus 126, 128 shrink, which may reduce the period in which the measurement of the secondary current $I_S$ can be performed. In some examples, the plateaus 126, 128 disappear when the DC current $I_{DC}$ rises too high. The drive voltage $V_D$ is modulated or otherwise changed in order to maintain the plateaus 126, 128. When the DC current $I_{DC}$ rises, the secondary current $I_S$ also rises. The rise in the secondary current $I_S$ causes a rise in the drive voltage $V_D$ so as to maintains the plateaus 126, 128.

When the DC current $I_{DC}$ falls, the secondary current $I_S$ also falls, which results in an increase in the plateau period $t_P$. The increase in the plateau period $t_P$ is not required and may be large due to a high drive voltage $V_D$, which consumes unneeded power. The sensor 300 overcomes this problem by reducing the drive voltage $V_D$ when the secondary current $I_S$ drops. Accordingly, the sensor 300 does not consume the power required to generate the high drive voltage $V_D$ when the secondary current $I_S$ is low.

In other examples or in addition to the examples described above, the voltage supply 302 may change the frequency of the drive voltage $V_D$ in response to the secondary current $I_S$. For example, when the secondary current $I_S$ is low, the frequency of the drive voltage $V_D$ can be increased because less time is required for the secondary current to reach a plateau 126, 128. When the secondary current $I_S$ is high, the frequency of the drive voltage $V_D$ can be reduced in order to provide time for the secondary current $I_S$ to reach a plateau 126, 128.

Various methods may be employed to monitor the secondary current $I_S$ and change the drive voltage $V_D$. In some examples, the amplitude of the drive voltage $V_D$ is directly related to the secondary current $I_S$. Far example, drive voltage $V_D$ is a function, such as a linear function, of the secondary current $I_S$. In some examples, a scaling factor multiplies either the secondary current $I_S$ or the drive voltage $V_D$. Accordingly, an increase or decrease in the secondary current $I_S$ results in a proportional increase or decrease in the drive voltage $V_D$. The same may apply to examples where the frequency of the drive voltage $V_D$ is changed in response to the secondary current $I_S$.

Figure 4:
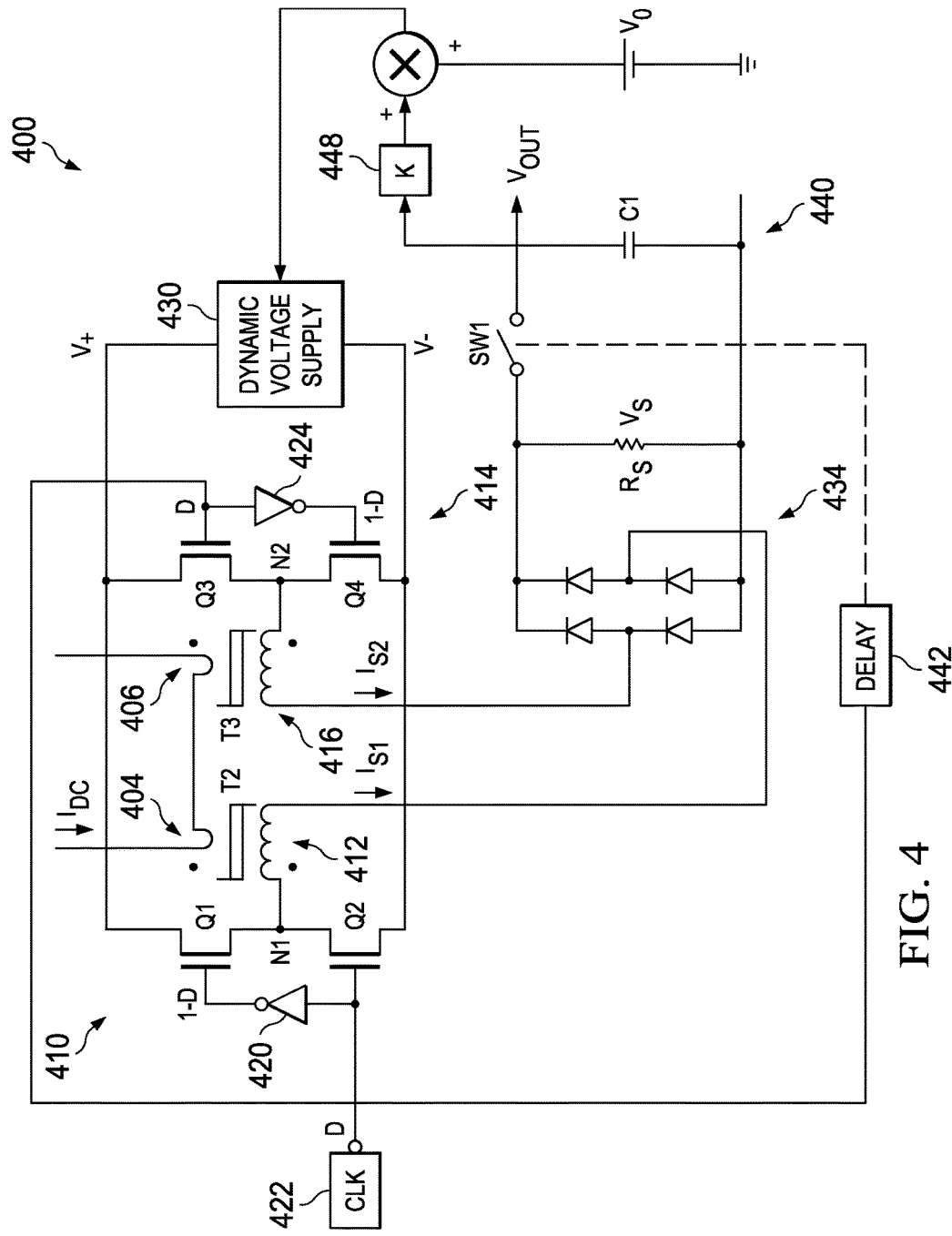
FIG. 4 is a detailed schematic diagram of an example of a current sensor.

FIG. 4 is a more detailed schematic diagram of an example of a two core current sensor 400. The current sensor 400 includes a first transformer T2 and a second transformer T3. The first transformer T2 has a primary 404 that is coupled in series with the primary 406 of the second transformer T3. The DC current to be measured, $I_{DC}$, flows through the primaries 404, 406 of both transformers T2, T3. The sensor 400 includes a first driver 410 that is coupled to the secondary 412 of the first transformer T2 and a second driver 414 that is coupled to the secondary 416 of the second transformer T3. As shown in FIG. 4, the transformers T2, T3 are configured so that their magnetizations are opposite. The secondary 412 of the first transformer T2 has a first secondary current $I_{S1}$ flowing through it in response to the DC current $I_{DC}$. Likewise, the secondary 416 of the second transformer T3 has a second secondary current $I_{S2}$ flowing through it in response to the DC current $I_{DC}$.

The first driver 410 includes a transistor Q1 coupled in series with a transistor Q2. The transistors described in FIG. 4 function as switches and other switching mechanisms may be used in lieu of transistors. The transistor Q1 and the transistor Q2 are coupled at a node N1, which is coupled to the secondary 412 of the first transformer T2. The gates of the transistors Q1, Q2 are coupled by an inverter 420. Accordingly, the transistors Q1, Q2 are in opposite states (on or off). The input of the inverter 420 and the gate of the transistor Q2 are coupled to a clock 422 that generates a clock signal identical or similar to the clock signal of FIG. 2A. The clock signal in the example of FIG. 4 operates at a duty cycle D, which may be 50% and has an amplitude sufficient to turn the transistors off and on. Based on the circuitry, the transistor Q2 operates at a duty cycle D and the transistor Q1 operates at a duty cycle 1-D. As described above, the duty cycle D is 50% in some examples, so the duty cycle 1-D is also 50%.

The second driver 414 is similar to the first driver 410 and includes a transistor Q3 and a transistor Q4 that are coupled in series at a node N2. The node N2 is coupled to the secondary 416 of the second transformer T3. The gates of the transistors Q3, Q4 are coupled by an inverter 424. The input of the inverter 424 and the gate of the transistor Q3 are coupled to the clock 422. Accordingly, the transistors Q2 and Q3 turn on and off together and the transistors Q1 and Q4 turn on and off together. The result is that one transformer charges by way of the DC current $I_{DC}$ and the other is simultaneously reset.

The drivers 410, 414 are coupled to a dynamic voltage supply 430 that generates a positive drive voltage V+ and a negative drive voltage V−, wherein the amplitudes and/or frequencies of the drive voltages V+, V− are set in response to the secondary currents $I_{S1}$, $I_{S2}$ of the transformers T2, T3. As shown by the configuration of the drivers 410, 414, the secondaries 412, 416 of the transformers T2, T3 have either the positive drive voltage V+ or the negative drive voltage V− applied to them. More specifically, when the node N1 is coupled to the positive drive voltage V+, the node N2 is coupled to the negative drive voltage V− and vice versa. Accordingly, only one transformer at a time is in saturation. There may be some loss between the voltage supply 430 and the nodes N1, N2, however, in this example, the drive voltages V+, V− are considered to be applied to the nodes N1, N2 irrespective of any loss.

The secondaries 412, 416 are coupled to a bridge 434, which is coupled to a shunt resistor $R_S$. The first secondary current $I_{S1}$ and the second secondary current $I_{S2}$ flow through the bridge 434 and generate a shunt voltage $V_S$ across the shunt resistor $R_S$, which is indicative of and/or proportional to the secondary currents $I_{S1}$, $I_{S2}$. The shunt resistor $R_S$ is coupled to a sample and hold circuit 440, which in the example of FIG. 4 includes a switch SW1 and a capacitor C1. The state of the switch SW1 is controlled by the clock 422 and a delay 442. The delay 442 enables the shunt voltage $V_S$ across the shunt resistor $R_S$ is to be sampled at a precise time. In some aspects, the delay is dynamic in that it changes in response to the frequency of the clock 422 to enable sampling during the plateau. As described above, the sampling occurs during the plateaus of the secondary currents $I_{S1}$, $I_{S2}$ which provides an accurate measurement of the DC current $I_{DC}$. When the switch SW1 closes, the sensing voltage $V_S$ across the sensing resistor RS is sampled and held by the capacitor C1.

The voltage across the capacitor C1 is the output voltage $V_{OUT}$ of the current sensor 400. The output voltage $V_{OUT}$ is fed back to the voltage supply 430, wherein the voltage supply 430 modulates or changes the drive voltages V+, V− in response to the output voltage $V_{OUT}$. The example of FIG. 4 includes a scaling factor K provided by an amplifier 448 that scales the output voltage $V_{OUT}$ before it is input to the voltage supply 430. The relationship between the secondary currents $I_{S1}$, $I_{S2}$ and the drive voltages V+, V− is substantially linear, so a simple K value can be used as the amplification of the amplifier 448. More specifically, the dominant parameter of the transformers T2, T3 is the saturated leakage which is essentially time and temperature invariant. The resistance in the secondaries 412, 416 is time invariant and temperature dependent, but the effect of change with temperature is insignificant and affects only the drive loses and not accuracy. Accordingly, because the effect of the saturated inductance is the most significant, a linear approximation correction function using only a gain factor K and a fixed initial voltage V0 (described below) is typically sufficient to operate the sensor 400.

The example of the sensor 400 of FIG. 4 includes the initial voltage V0 that is added to the feedback to the voltage supply 430. The initial voltage V0 is a minimal voltage input that causes the voltage supply 430 to generate drive voltages V+, V− when the DC current $I_{DC}$ is minimal or nonexistent. Without the addition of the initial voltage V0, the drive voltages V+, V− may drop to levels that prevent the current sensor 400 from operating correctly when the DC current $I_{DC}$ drops or is nonexistent. In some examples, the minimum drive voltage $V_D$ is determined by the resistance of the windings in the secondaries 412, 416.

Figure 5:
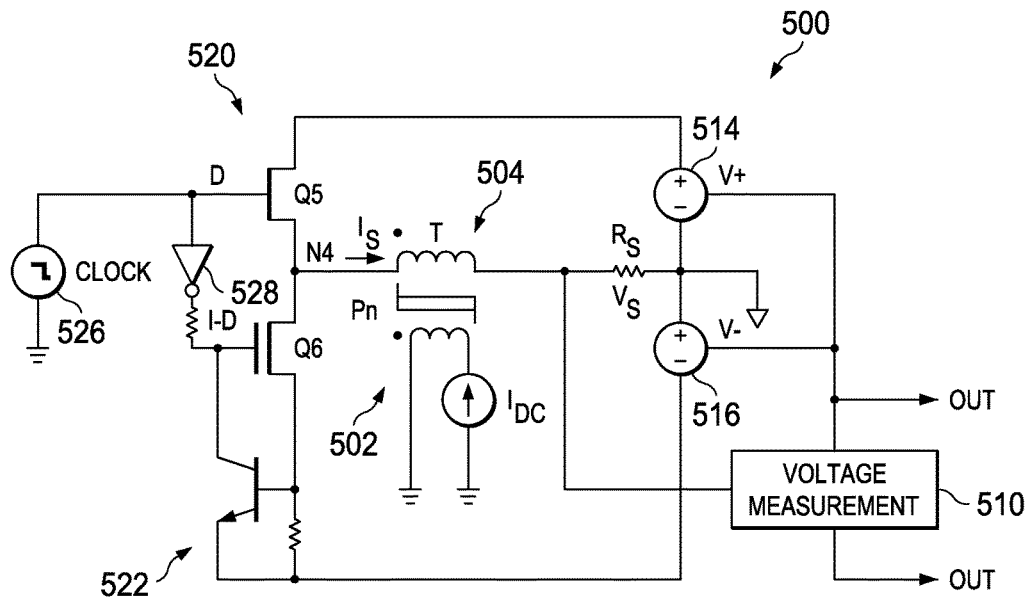
FIG. 5 is a schematic diagram of an example of a current sensor that has a single core or transformer.

FIG. 5 is a schematic diagram of an example of a current sensor 500 that has a single core or transformer T4. Unlike the above-described current sensors, the current sensor 500 is not bidirectional and only measures DC current $I_{DC}$ flowing in one direction. The current sensor 500 has a single transformer T4, so the DC current $I_{DC}$ only flows through the primary 502 of the one transformer T4. One side of the secondary 504 of the transformer T4 is coupled to a shunt resistor $R_S$ that converts the secondary current $I_S$ to a shunt voltage $V_S$. The shunt voltage $V_S$ is measured by a voltage measurement device 510. As described above, the voltage measurement is performed during a plateau of the secondary current $I_S$. The voltage measurement device 510 has an output that provides a signal, such as a voltage, that is indicative of the DC current $I_{DC}$. The output is coupled to a positive voltage supply 514 that supplies the positive drive voltage V+ and a negative voltage supply 516 that supplies the negative drive voltage V−. In some examples, the positive voltage supply 514 and the negative voltage supply 516 are a single voltage supply as shown in FIG. 3.

The other side of the secondary 504, the positive voltage supply 514, and the negative voltage supply 516 are coupled to a drive circuit 520. The drive circuit 520 includes a transistor Q5 and a transistor Q6 coupled at a node N4, which is coupled to the secondary 504 of the transformer T4. The transistor Q5 is coupled to the positive drive voltage 514 and the transistor Q6 is coupled to the negative voltage supply 516 by way of a current limiter 522. In some examples, the current limiter 522 is set to a current value that is nearly equal to the saturation current of the transformer T4.

The gates of the transistors Q5, Q6 are driven by a clock 526 that produces a square wave as shown in FIG. 2A. The clock 526 is coupled to the gate of the transistor Q5 and is coupled to the gate of the transistor Q6 by way of an inverter 528. Accordingly, the gate of the transistor Q5 is driven with a duty cycle D and the gate of the transistor Q6 is driven with a duty cycle of 1-D. In the example of FIG. 5, the duty cycle D is 50%, so the transistors Q5, Q6 are driven at the same duty cycle.

The current sensor 500 drives the secondary 504 of the transformer T4 with the positive drive voltage V+ for the duration D. During this period, the DC current $I_{DC}$ induces the secondary current $I_S$, which flows through the shunt resistor $R_S$. When the voltage across the shunt resistor $R_S$ reaches a plateau, the voltage measuring device 510 measures the voltage. Accordingly, the voltage at the plateau corresponds to a secondary current $I_S$ of $I_{DC}/N$. During the period of 1-D, the negative drive voltage V− is coupled to the secondary 504 through the current limiter 522. This coupling causes the transformer T4 to reset by forcing it close to saturation. At some time after the voltage measuring device 510 measures the voltage across the shunt resistor $R_S$, the positive drive voltage V+ is changed or modulated to reflect the secondary current $I_S$. More specifically, the positive drive voltage V+ is changed to maintain the plateau in the secondary current $I_S$ within predetermined boundaries when the drive voltage V+ is applied to the secondary 504. The result is accurate current measurements when the DC current $I_{DC}$ is high and low power dissipation when the DC current $I_{DC}$ is low.

Figure 6:
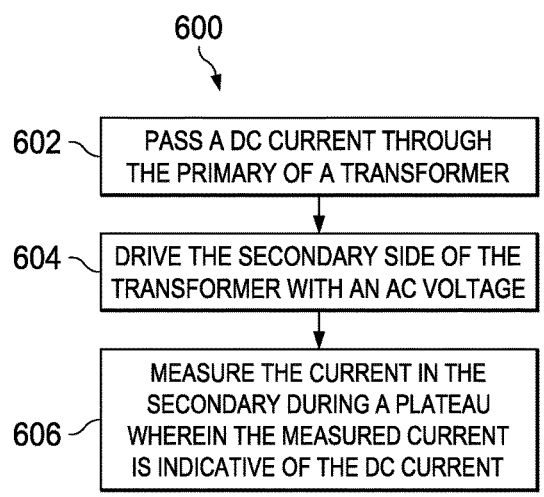
FIG. 6 is a flow chart describing an example of the operation of a current sensor.

The operation of a DC current sensor is described by the flow chart 600 of FIG. 6. In step 602, a DC current is passed through the primary of a transformer. In step 604, the secondary side of the transformer is driven with an AC voltage. In step 606, the current in the secondary is measured during a plateau wherein the measured current is indicative of the DC current.

While illustrative and presently preferred embodiments of current sensors have been described in detail herein, it is to be understood that the concepts may be otherwise variously embodied and employed and that the appended claims are intended to be construed to include such variations except insofar as limited by the prior art.

What is claimed is:

1. A method for measuring current, the method comprising:
    passing a DC current through the a primary side of a transformer;
    driving a secondary side of the transformer with an AC voltage generated by a dynamic voltage supply; and
    measuring the secondary current during a plateau, wherein the measured current is indicative of the DC current, wherein driving the secondary side of the transformer comprises:
        generating an increasing amplitude AC voltage in the dynamic voltage supply in response to an increase in the secondary current.

2. The method of claim 1, wherein driving the secondary side of the transformer comprises:
    generating a decreasing amplitude of the AC voltage in the dynamic voltage supply in response to a decrease in the secondary current.

3. The method of claim 1, wherein driving the secondary side of the transformer comprises:
    increasing the frequency of the AC voltage in response to a decrease in the secondary current; and
    decreasing the frequency of the AC voltage in response to an increase in the secondary current.

4. The method of claim 1, wherein a first portion of a cycle of the AC voltage magnetizes the secondary and wherein a second portion of the cycle of the AC voltage drives the transformer toward saturation.

5. The method of claim 4, wherein the current flow in the secondary is limited to a predetermined value during the second portion of the cycle of the AC voltage.

6. The method of claim 4, wherein the current flow in the secondary is limited to a value that is less than the saturation current of the transformer.

7. The method of claim 4, wherein the current flow in the secondary is limited to a value that is approximately the saturation current of the transformer.

8. A method for measuring current, the method comprising:
    passing a DC current through the primary side of a first transformer;
    passing the DC current through the primary side of a second transformer;
    driving the secondary side of the first transformer with a first voltage supply;
    driving the secondary side of the second transformer with a second voltage supply, the second drive voltage having the opposite polarity as the first drive voltage;
    wherein one of a first secondary current in the secondary side of the first transformer or a second secondary current in the secondary side of the second transformer reaches a plateau;
    measuring the one of the first secondary current or the second secondary current during the plateau; and
    utilizing a dynamic voltage supply for increasing the amplitude of the first voltage supply and the amplitude of the second voltage supply in response to one of the first secondary current or the second secondary current increasing to maintain the plateau.

9. The method of claim 8, wherein driving the secondary side of the first transformer and driving the secondary side of the second transformer comprises saturating one of the first transformer or the second transformer.

10. The method of claim 8, further comprising changing the first drive voltage and the second drive voltage in response to the measuring to maintain the plateau.

11. The method of claim 10, further comprising maintaining the first voltage supply and the second voltage supply at predetermined levels in response to one of the first secondary current or the second secondary current falling below a predetermined level.

12. The method of claim 8, further comprising:
    decreasing the amplitude of the first voltage supply and the amplitude of the second voltage supply in response to one of the first secondary current or the second secondary current decreasing.

13. The method of claim 11 wherein the amplitude of the first voltage supply and the amplitude of the second voltage supply are linearly proportional to one of the first secondary current or the second secondary current.

14. The method of claim 8, wherein the first voltage supply and the second voltage are AC voltages, and further comprising:
    increasing the frequency of the first drive voltage and the frequency of the second drive voltage in response to one of the first secondary current or the second secondary current decreasing; and
    decreasing the frequency of the first voltage supply and the frequency of the second voltage supply in response to one of the first secondary current or the second secondary current increasing to maintain the plateau.

15. A DC current sensor comprising:
    a transformer having a primary side and a secondary side, wherein the DC current is passable through the primary side;
    a dynamic voltage supply is couplable to the secondary side, wherein the voltage supply is for driving the secondary side with an AC voltage; and
    a current monitor couplable to the secondary side for measuring a secondary current flowing in the secondary side during a period when the secondary current is at a plateau, wherein the dynamic voltage supply increases an amplitude of the drive voltage increases in response to an increase in the secondary current to maintain the plateau.

16. The DC current sensor of claim 15, wherein the current monitor comprises a sample and hold circuit.

17. The DC current monitor of claim 15 wherein the first dynamic voltage supply changes in response to the secondary current to maintain the plateau.

18. The DC current monitor of claim 15, wherein the amplitude of the voltage from the dynamic voltage supply decreases in response to a decrease in the secondary current.

19. The DC current sensor of claim 15, wherein the frequency of the dynamic voltage supply increases in response to the secondary current decreasing, and wherein the frequency of the dynamic voltage supply decreases in response to the secondary current increasing.

20. The DC current sensor of claim 15, wherein a portion of a cycle of the drive voltage drives the transformer toward saturation.

21. A DC current sensor comprising:
a first transformer having a primary side and a secondary side, wherein the DC current is passable through the primary side;
a second transformer having a primary side and a secondary side, wherein the primary side is coupled in series with the primary side of the first transformer;
a first voltage supply coupled to the secondary side of the first transformer, wherein the first drive voltage is for driving the secondary side of the first transformer with a first AC voltage;
a second voltage supply coupled to the secondary side of the second transformer, wherein the second drive voltage is for driving the secondary side of the second transformer with a second AC voltage, wherein the first AC voltage is the complement of the second AC voltage; and
a current monitor for measuring a secondary current flowing in the secondary side of at least either the first transformer or the second transformer during a period when the secondary current is at a plateau, wherein the amplitudes of the first voltage supply and the second voltage supply increase in response to an increase in the secondary current to maintain the plateau, and wherein the amplitudes of the first voltage supply and the second voltage supply decrease in response to a decrease in the secondary current.

22. The DC current sensor of claim 21, wherein the current monitor comprises a sample and hold circuit.

23. The DC current monitor of claim 21 wherein the first voltage supply and the second voltage supply change in response to the secondary current to maintain the plateau.

24. The DC current monitor of claim 21, wherein the amplitudes of the first voltage supply and the second voltage supply increase in response to an increase in the secondary current to maintain the plateau, and wherein the amplitudes of the first voltage supply and the second voltage supply decrease in response to a decrease in the secondary current.

25. The DC current sensor of claim 21, wherein the frequencies of the first voltage supply and the second voltage supply increase in response to the secondary current decreasing, and wherein the frequencies of the first voltage supply and the second voltage supply decrease in response to the secondary current increasing.

26. The DC current sensor of claim 21, wherein either the first transformer or the second transformer is driven to saturation by either the first drive voltage or the second drive voltage.

* * * * *